(12) United States Patent
Dadheech et al.

(10) Patent No.: US 9,896,763 B2
(45) Date of Patent: Feb. 20, 2018

(54) PARTICLE REACTOR FOR ATOMIC LAYER DEPOSITION (ALD) AND CHEMICAL VAPOR DEPOSITION (CVD) PROCESSES

(71) Applicant: GM Global Technology Operations LLC, Detroit, MI (US)

(72) Inventors: Gayatri V. Dadheech, Bloomfield Hills, MI (US); Mei Cai, Bloomfield Hills, MI (US); Prasad Gadgil, Santa Clara, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/154,358

(22) Filed: May 13, 2016

(65) Prior Publication Data
US 2017/0327948 A1 Nov. 16, 2017

(51) Int. Cl.
  C23C 16/40 (2006.01)
  C23C 16/455 (2006.01)
  C23C 16/44 (2006.01)

(52) U.S. Cl.
  CPC ........ *C23C 16/45544* (2013.01); *C23C 16/40* (2013.01); *C23C 16/4417* (2013.01); *C23C 16/45531* (2013.01)

(58) Field of Classification Search
  CPC ................................................. C23C 16/4417
  See application file for complete search history.

(56) References Cited

U.S. PATENT DOCUMENTS

| | | | |
|---|---|---|---|
| 2,161,950 A * | 6/1939 | Christensen | H04R 21/00 118/303 |
| 3,991,225 A * | 11/1976 | Blouin | A61K 9/28 23/293 A |
| 5,515,620 A * | 5/1996 | Butler | E01C 19/05 34/137 |
| 7,405,013 B2 | 7/2008 | Yang et al. | |
| 7,443,003 B2 | 10/2008 | Yang et al. | |
| 7,493,766 B2 | 2/2009 | Yang et al. | |
| 7,648,552 B2 | 1/2010 | Yang et al. | |
| 7,919,210 B2 | 4/2011 | Stabler et al. | |
| 8,227,681 B2 | 7/2012 | Ulicny et al. | |
| 8,316,650 B2 | 11/2012 | Yang et al. | |
| 9,236,639 B2 | 1/2016 | Yang et al. | |

(Continued)

*Primary Examiner* — David P Turocy
(74) *Attorney, Agent, or Firm* — Harness, Dickey & Pierce, P.L.C.

(57) ABSTRACT

A powder coating apparatus reactor includes a loading port for a powder material, an inlet for one or more coating precursors, and a reaction chamber having an inner surface and a plurality of axial baffles. Each axial baffle extends inwardly from the inner surface of the reaction chamber of the rotary vessel. The plurality of axial baffles is configured to keep the powder material flowing within the reaction chamber during rotation of the rotary vessel to facilitate contact between the powder material and the one or more coating precursors. The powder coating apparatus further includes a rotary vacuum seal located at the loading port. The powder coating apparatus also includes a motor capable of actuating the rotary vessel about a center axis for rotation during reaction of the powder material with the coating precursors in the reaction chamber. Methods for coating powder materials with such a reactor are also provided.

4 Claims, 6 Drawing Sheets

(56) References Cited

U.S. PATENT DOCUMENTS

Figure 1:
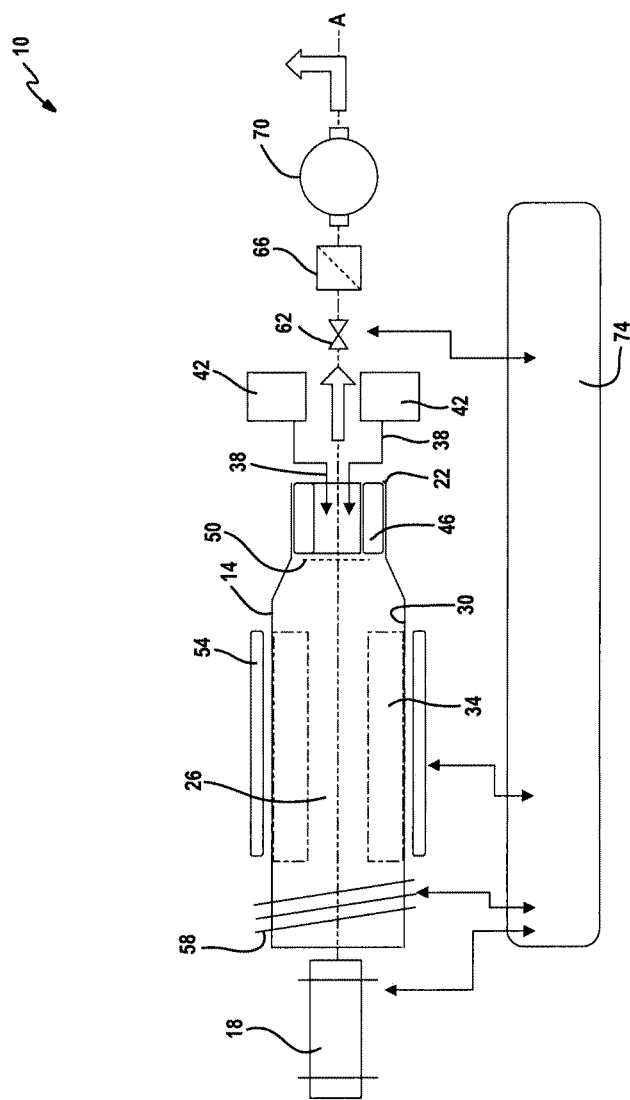

| | | |
|---|---|---|
| 2006/0028182 A1 | 2/2006 | Yang et al. |
| 2006/0193978 A1* | 8/2006 | Toth .......................... B22F 1/02 |
| | | 427/212 |
| 2010/0111754 A1 | 5/2010 | Yang et al. |
| 2010/0155675 A1 | 6/2010 | Yang et al. |
| 2010/0186422 A1 | 7/2010 | Yang et al. |
| 2011/0056531 A1 | 3/2011 | Meisner et al. |
| 2011/0200822 A1* | 8/2011 | Detavernier ........ C23C 16/4417 |
| | | 428/402 |
| 2012/0276305 A1* | 11/2012 | Hamalainen ............ C23C 16/08 |
| | | 427/569 |

* cited by examiner

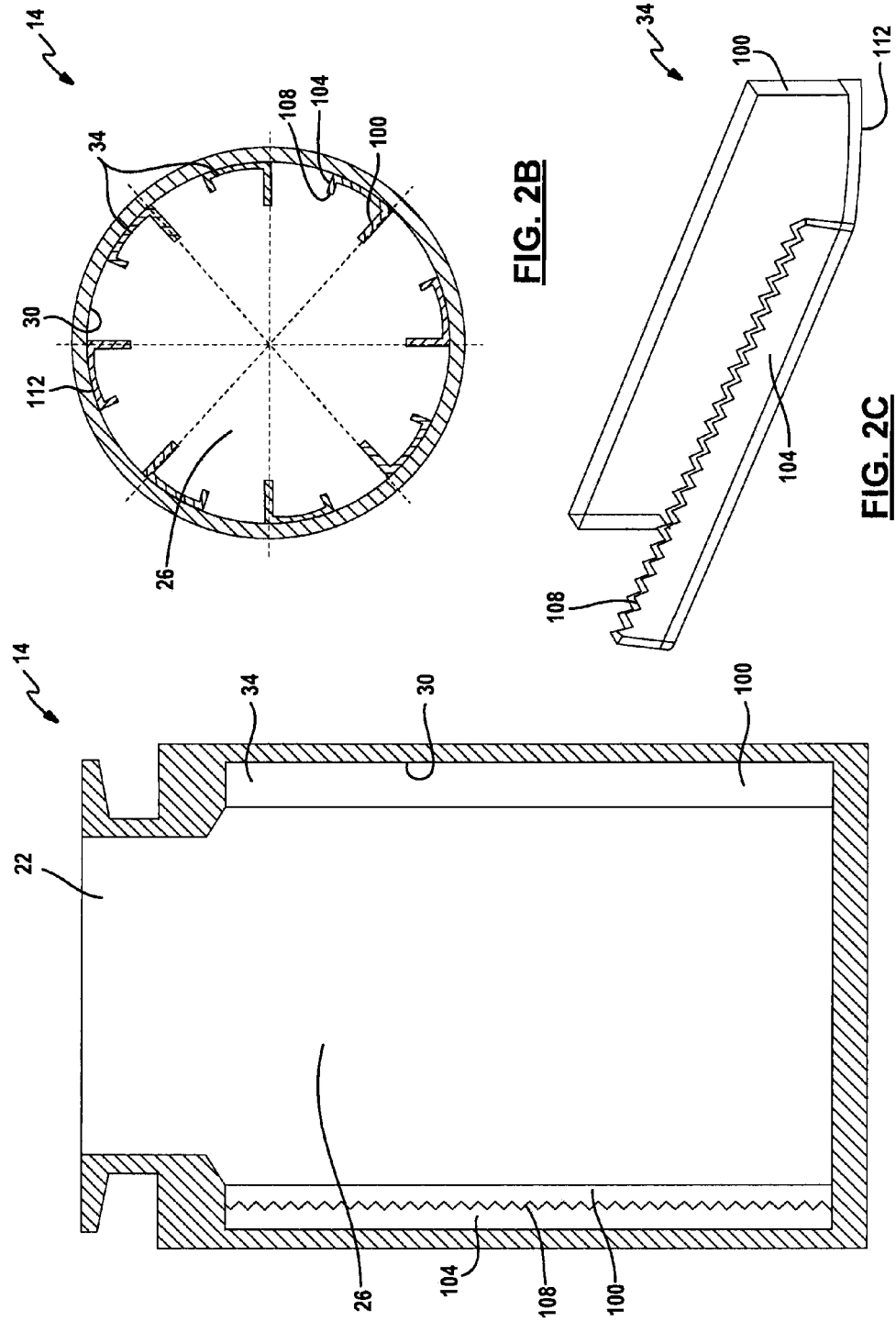

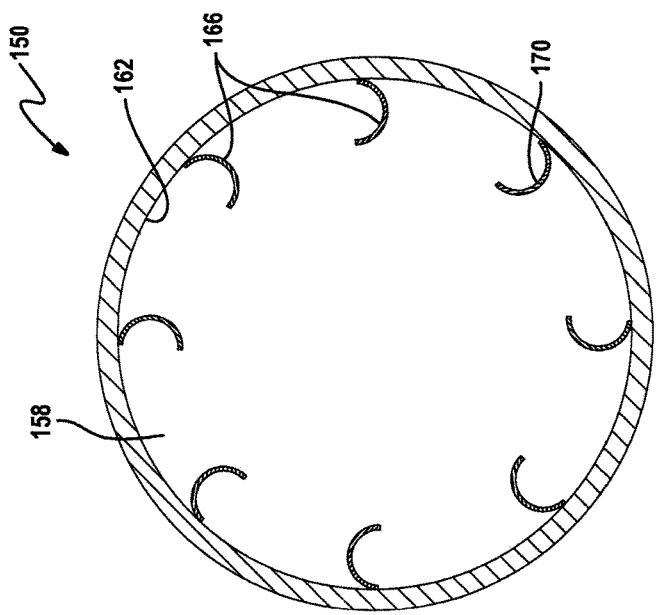
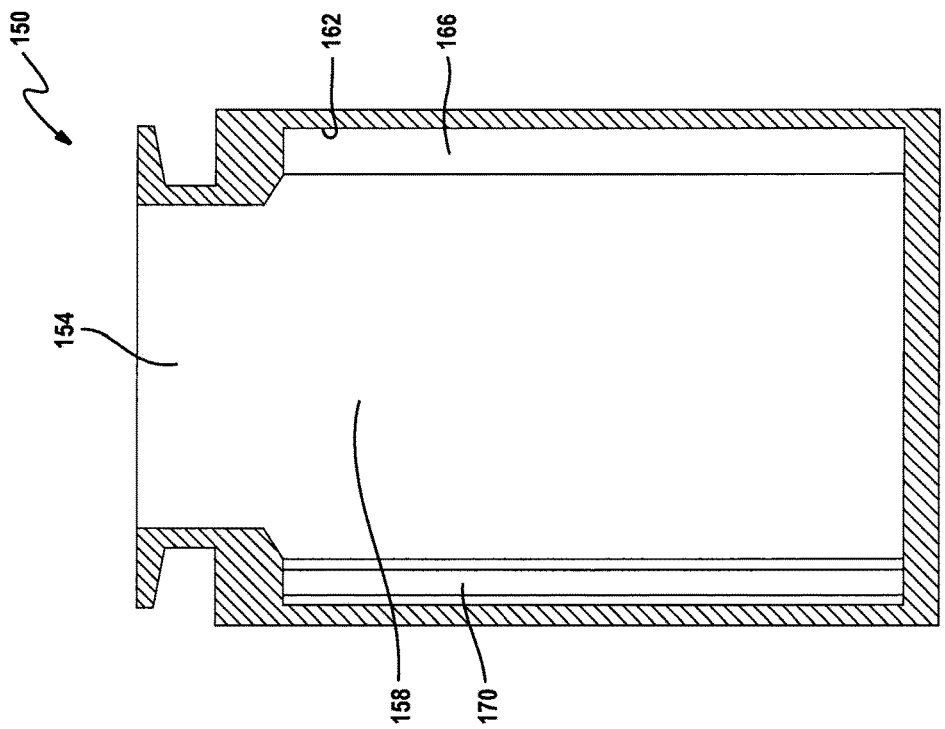

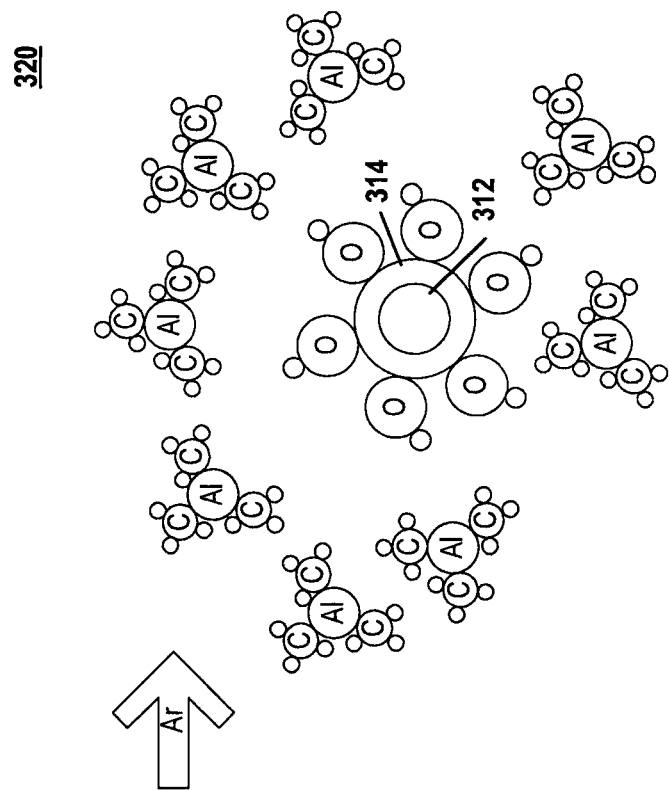
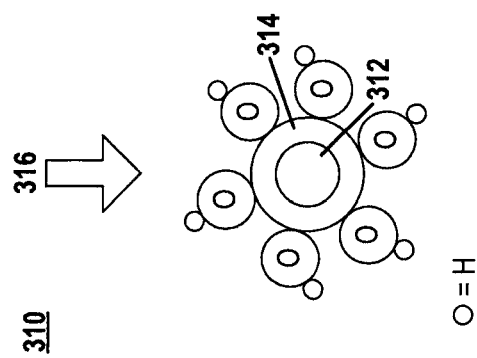
FIG. 4B
FIG. 4A

PARTICLE REACTOR FOR ATOMIC LAYER DEPOSITION (ALD) AND CHEMICAL VAPOR DEPOSITION (CVD) PROCESSES

FIELD

The present disclosure relates to an apparatus and a method for depositing films or coatings onto nanoparticles, and more particularly to a particle coating system including a reactor for atomic layer deposition (ALD) or chemical vapor deposition (CVD) of a thin film on a powder or particulate substrate.

BACKGROUND

This section provides background information related to the present disclosure which is not necessarily prior art.

Core/shell nanoparticles may be used in a variety of applications, such as in the formation of an electrode of a battery. The core may be any type of powder particle. The shell may be a thin coating, which may be applied by a process such as chemical vapor deposition (CVD) or atomic layer deposition (ALD). In CVD, a mixture of gases flows around heated substrate particles to form a thin solid film to grow on the surface of particles by heterogeneous reaction. Byproducts are desorbed and pumped away. ALD, a variation of CVD, is a self-limiting process for chemical deposition or growth of ultrathin films on a substrate. ALD typically involves subjecting the target substrate particles to self-saturating surface reactions with a single vapor of precursor materials or multiple vapors introduced sequentially having the precursors of the surface coating. Each surface reaction results in a film that is one atomic layer thick. The surface reactions may be conducted sequentially and/or in an alternating fashion, depending on the composition and structure of the coating or film desired.

However, where the substrate is a powder or solid particles, the particles often clump together during the ALD and/or CVD process. Such clumping blocks active sites on the substrate particles and prevents adequate reaction with the precursors, resulting in particles that are not well coated; for example, on average only about 40% may be coated.

In fluidized bed reactors, a portion of the substrate particles settles to the bottom of the reactor and clumps together, thereby resulting in a low coating efficiency. Moreover, fluidized bed reactors are easily clogged and require a large amount of carrier gas. Alternatively, in rotary powder coaters, the substrate particles are contained in a small rotary tube and tend to clump together, reducing coating efficiency as described above. Rotary powder coaters are also susceptible to clogging and are uneconomical on a large scale. Cascade coaters maybe used to semi-continuously coat substrate powders. Cascade coaters include a series of vertically-connected reactors. Each reactor consists of a powder reservoir located above a precursor reservoir, where the two reservoirs are separated by a valve. The valve is opened to fluidize the powder substrate and achieve vapor deposition of a precursor onto the surface of the powder substrate. Each reactor may have independent pressure and temperature control. Coated substrate powder may be transferred down into subsequent reactors in the cascade coaters for exposure to additional precursors. However, the number of reactors and coating steps is limited due to space constraints. Mechanical failure of cascade coating systems is common because of its mechanical complexity and the need for a high degree of synchronization. Similar to the reactors described above, substrate powder in cascade coaters is subject to clumping. It would be desirable to develop a reactor for ALD and CVD that facilitates greater separation of substrate particles for more efficient coating.

SUMMARY

This section provides a general summary of the disclosure, and is not a comprehensive disclosure of its full scope or all of its features.

In certain aspects, the present disclosure provides a powder coating apparatus. The powder coating apparatus includes a loading port for receiving a powder material, an inlet for receiving one or more coating precursors, and a reaction chamber having an inner surface and a plurality of axial baffles. Each axial baffle of the plurality extends inwardly from the inner surface of the reaction chamber of the rotary vessel. The plurality of axial baffles is configured to keep the powder material flowing within the reaction chamber during rotation of the rotary vessel to facilitate contact between the powder material and the one or more coating precursors. The powder coating apparatus further includes a rotary vacuum seal located at the loading port of the rotary vessel. The powder coating apparatus also includes a motor capable of actuating the rotary vessel about a center axis for rotation during reaction of the powder material with the coating precursors in the reaction chamber.

In other aspects, the present disclosure provides a method for atomic layer deposition (ALD) of a thin film on a powder substrate in a rotary vessel having an inner surface defining a reaction chamber and a plurality of axial baffles. Each axial baffle extends inwardly from the inner surface of the rotary vessel. The method includes introducing a powder substrate into a rotating rotary vessel. The powder substrate is introduced to a stoichiometric excess of a first precursor for a first duration at a first temperature. The excess first precursor and reaction byproducts are removed from the reaction chamber. The powder substrate is exposed to a stoichiometric excess of a second precursor for a second duration at a second temperature. The excess second precursor and reaction byproducts are removed from the reaction chamber. In this manner, a thin film is formed on the powder substrate.

In yet other aspects, the present disclosure provides a method of atomic layer deposition (ALD) of a metal phosphate thin film on a powder substrate in a rotary vessel. The rotary vessel has an inner surface defining a reaction chamber and a plurality of axial baffles. Each axial baffle extends inwardly from the inner surface of the rotary vessel. The method includes introducing a powder substrate into a rotating rotary vessel. The powder substrate is exposed to a stoichiometric excess of a first precursor and a stoichiometric excess of a second precursor. In certain aspects, the first precursor comprises a metal halide and the second precursor comprises a phosphorous source. The excess first precursor, excess second precursor, and reaction byproducts are removed from the reaction chamber. The powder substrate is exposed to a stoichiometric excess of a third precursor. In certain aspects, the third precursor optionally comprises an oxygen source. The excess third precursor and reaction byproducts are removed from the reaction chamber, thereby forming the powder substrate having the metal phosphate thin film.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 is a schematic of a powder coating system according to certain aspects of the present disclosure;

FIGS. 2A-2C. FIGS. 2A-2B are cross-sectional views of a rotary vessel of the powder coating system of FIG. 1. FIG. 2C is a perspective view of an axial baffle of the rotary vessel of FIGS. 2A and 2B;

FIGS. 3A and 3B are cross-sectional views of a rotary vessel according to certain aspects of the present disclosure; and FIGS. 4A-4F. FIGS. 4A-4F show exemplary schematics illustrating formation of aluminum oxide ($Al_2O_3$) coatings on a powder substrate particle by an atomic layer deposition (ALD) process.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. In addition, disclosure of ranges includes disclosure of all values and further divided ranges within the entire range, including endpoints given for the ranges.

As used herein, the terms "composition" and "material" are used interchangeably to refer broadly to a substance containing at least the preferred chemical compound, but which may also comprise additional substances or compounds, including impurities.

The present technology relates to a reactor for coating powder particles. The powder particles may be coated using atomic layer deposition (ALD) or continuous vapor deposition (CVD) processes, by way of example. A schematic of a powder coating system is shown in FIG. 1. A powder coating system 10 may include a rotary vessel 14. The rotary vessel 14 may be actuated about a center axis A by a motor 18. The rotary vessel 14 may include a loading port 22 for receiving a powder substrate and a reaction chamber 26 having an inner surface 30. A plurality of axial baffles 34 may extend inwardly from the inner surface 30 of the reaction chamber 26. The rotary vessel 14 may also include at least one precursor inlet 38 for receiving one or more coating precursors, which may be stored in precursor storage tanks 42.

The loading port 22 of the rotary vessel 14 may be sealed with a rotary vacuum seal 46. A porous membrane 50, which may be perforated wire mesh, may be located inside the rotary vessel 14 adjacent to the rotary vacuum seal 46. The size of the wire mesh may be determined based on the size of substrate particles. The powder coating system 10 may also include an external fixed heater 54 with active temperature control. The powder coating system 10 may further include a plasma source 58 in fluid communication with the reaction chamber 26. The plasma source may be inductively coupled RF, capacitively coupled RF, or microwave discharge, by way of example. The reaction chamber may be in fluid communication with a pneumatic valve 62, a filter 66, and a vacuum pump 70. The powder coating system 10 may further include a control system 74 with various controls. Such controls may include active temperature control, flow routing and valves for controlling the amount of exposure of the powder substrate particles to the coating precursor, motor speed, and a plasma source.

Referring to FIGS. 2A-2C, each axial baffle 34 may include a first inwardly extending rib 100 and a second inwardly-extending rib 104. An innermost surface 108 of the second inwardly-extending rib 104 may be serrated. Each axial baffle 34 may have an outer surface 112 that is fused to the inner surface 30 of the rotary vessel 14. The curvature of the outer surface 112 of the axial baffle 34 may match the curvature of the inner surface 30 of the rotary vessel 14.

The use of axial baffles 34 may facilitate continuous flow of the powder substrate particles during operation of the powder coating system 10. More specifically, rotation of the rotary vessel 14 may cause the powder substrate particles to tumble in the reaction chamber 26 and contact the axial baffles 34. Such contact with the axial baffles 34, especially the first rib 100, the second rib 104, and the serrated surface 108, will cause the particles to separate and move freely about the reaction chamber 26, creating a constant stream of falling powder. The axial baffles 34 are thus designed to maintain movement of the powder particles (e.g., a powder fall) during rotation of the rotary vessel 14 in the powder coating system 10 to ensure separation and ample exposure of surfaces of individual particles to the gases flowing within the reaction chamber 26. When used with a vapor precursor, the powder coating system 10 may be capable of coating greater than or equal to about 70% of the exposed surface area of the powder particles and less than or equal to about 100% of the exposed surface area of the powder particles. In certain variations, the powder coating system 10 may be capable of coating greater than or equal to about 80% of the exposed surface area of the powder particles and less than or equal to about 100% of the exposed surface area of the powder particles. In still other variations, the powder coating system 10 may be capable of coating greater than or equal to about 90% of the exposed surface area of the powder particles to 100% of the exposed surface area surface of the powder particles.

Referring to FIGS. 3A-3B, an alternate rotary vessel 150 is provided. The rotary vessel 150 may include a loading port 154 for receiving a powder substrate and a reaction chamber 158 having an inner surface 162. A plurality of axial baffles 166 may extend inwardly from the inner surface 162 of the reaction chamber 158. The axial baffles 166 may be semi-circular in cross section. A curved surface 170 of the axial baffles 166 can facilitate flow of the powder particles during operation of the powder coating system. The axial baffles 166 may be fused or otherwise attached to the inner surface 162 of the reaction chamber 158. The geometry of the axial baffles is not limited to the configurations discussed above and other configurations are contemplated within the present disclosure. By way of example, the axial baffles may comprise a single serrated rib or a series of radial protrusions, tines, pins, or the like.

In certain variations, the powder coating system may be used batchwise for coating powder particles. In other variations, the powder coating system may be configured for continuous flow of powder substrate particles. The powder coating system may include a reaction chamber with a substrate inlet and a substrate outlet located along the center axis of the reaction chamber. Substrate particles may be introduced into the reaction chamber on a pulse of carrier gas.

In certain aspects, the present disclosure provides a method for atomic layer deposition (ALD) of a thin film on a powder substrate using the powder coating system of the present disclosure. With renewed reference to FIG. 1, the powder substrate particles may be loaded into the rotary vessel 14 through the loading port 22. The porous membrane 50 and the rotary vacuum seal 46 may be replaced on the rotary vessel 14. The rotary vessel 14 may be actuated about the center axis A by the motor 18. The rotational speed may be greater than or equal to about 20 rpm and less than or equal to about 70 rpm. In certain variations, the rotational speed may be greater than or equal to about 30 rpm and less than or equal to about 60 rpm. The axial baffles 34 of the rotary vessel 14 may facilitate continuous flow of the powder substrate particles during operation of the powder coating system 10 by causing the powder substrate particles to tumble in the reaction chamber 26 and contact the axial baffles 34. Such contact with the axial baffles 34, especially the first rib 100, the second rib 104, and the serrated surface 108, may cause the particles to separate and move freely about the reaction chamber 26, creating a constant stream of falling powder.

The powder precursor particles may be pre-treated, for example, with oxygen plasma ($O_2$) or peroxide ($H_2O_2$) prior to introduction of a precursor. A stoichiometric excess of a first vapor precursor may be introduced into the reaction chamber 26 through the precursor inlet 38. The first vapor precursor may be pulsed into the reaction chamber 26 on a carrier gas, for example, argon or nitrogen.

The external heater 54 may be used to bring the reaction chamber 26 and the powder substrate particles to a first temperature. The temperature within the reaction chamber is desirably high enough that reaction between the substrate and the precursors occurs, while also preventing condensation of the precursor vapor onto the inner surface 30 of the reaction chamber 26. As non-limiting examples, the first temperature may be greater than or equal to room temperature (e.g., approximately 21° C.) and less than or equal to about 600° C. In other variations, the first temperature may be greater than or equal to about 150° C. and less than or equal to about 250° C.

The downstream valve 62 may be closed to increase the pressure of the reaction chamber 26. In some variations, the pressure of the reaction chamber may be greater than or equal to about 1 millitorr to less than or equal to about 500 torr. For example, the pressure of the reaction chamber without the use of plasma may range from greater than or equal to about 1 millitorr to less than or equal to about 500 torr. When RF plasma is used in the reaction chamber, the pressure may be greater than or equal to about 1 millitorr to less than or equal to about 50 millitorr. For use of microwave discharge plasma, the pressure in the reaction chamber may be greater than or equal to about 5 millitorr to less than or equal to about 50 millitorr, by way of example. The rotary vessel 14 may continuously rotate while the powder substrate particles are saturated with the first vapor precursor. The powder substrate particles may be exposed to the first vapor precursor for duration of greater than or equal to about 10 milliseconds to less than or equal to about 1000 seconds, by way of non-limiting example. In other variations, the powder substrate particles may be exposed to the first vapor precursor for greater than or equal to about 100 milliseconds to less than or equal to about 200 milliseconds. The ALD process and surface reactions may produce a single atomic layer of the surface coating material that is bound to the powder substrate particle surface, thereby providing a monoatomic coating.

Next, the valve 62 may be opened so that the excess first vapor precursor and reaction byproducts can be removed from the reaction chamber 26. The excess first vapor precursor and reaction byproducts may be quickly purged, for example, by operation of the vacuum pump 70 and/or flushing with an inert gas, such as argon or nitrogen. The porous membrane 50 may ensure that the powder substrate particles remain in the reaction chamber 26 during removal of the excess first vapor precursor and reaction byproducts. The filter 66 may trap solid particles as the excess first vapor precursor and reaction byproducts are pumped to the exhaust. The time to remove excess precursor and reaction byproducts may be greater than or equal to about 10 milliseconds and less than or equal to about 1000 seconds, by way of non-limiting example. In certain variations, the time to remove excess precursor and reaction byproducts may be approximately 1 second.

A stoichiometric excess of a second vapor precursor may be introduced into the reaction chamber 26 through the precursor inlet 38. The second vapor precursor may be pulsed into the reaction chamber 26 on a carrier gas. In some variations, the second vapor precursor may be a plasma. In certain variations, a plasma precursor may be pulsed into the reaction chamber without use of a carrier gas. Notably, the plasma source 58 may be used to generate and/or maintain the second vapor precursor in a plasma state.

The external heater 54 may be used to bring the reaction chamber 26 and the powder substrate particles to a second temperature. When the second vapor precursor is a plasma, reactivity is generally higher, and therefore less thermal energy is required for deposition. Thus, for use of a plasma, the second temperature may be greater than or equal to room temperature (e.g., approximately 21° C.) and less than or equal to about 150° C., by way of non-limiting example. In certain variations, the second temperature may be greater than or equal to about 50° C. and less than or equal to about 100° C.

The downstream valve 62 may be closed to increase the pressure of the reaction chamber 26. Reactions may occur at lower pressures when the second vapor precursor is a plasma. For example, the second pressure may be greater than or equal to about 50 millitorr and less than or equal to about 1 torr for RF plasma, and greater than or equal to about 50 millitorr and less than or equal to about 5 torr for microwave plasma.

The rotary vessel may continuously rotate while the powder substrate particles are saturated with the second vapor precursor. The powder substrate particles may be exposed to the second vapor precursor for second duration of greater than or equal to about 10 milliseconds and less than or equal to about 1000 seconds, by way of non-limiting example. When the second vapor precursor is a plasma, the second duration may be greater than or equal to about 1 second and less than or equal to about 5 seconds.

Next, the valve 62 may be opened so that the excess second vapor precursor and reaction byproducts can be removed from the reaction chamber. The excess second vapor precursor and reaction byproducts may be quickly purged, for example, by operation of the vacuum pump 70 and/or flushing with an inert gas. The porous membrane 50 may ensure that the powder substrate particles remain in the reaction chamber 26 during removal of the excess second vapor precursor and reaction byproducts. The filter 66 may trap solid particles as the excess second vapor precursor and reaction byproducts are pumped to the exhaust. The time to remove excess precursor and reaction byproducts may be greater than or equal to about 10 milliseconds to less than or equal to about 1000 seconds, by way of non-limiting example. In certain variations, the time to remove excess precursor and reaction byproducts may be approximately 1 second.

The ALD process and surface reactions may produce a single atomic layer of the surface coating material that may be bound to the powder substrate particle surface, thereby providing a monoatomic coating. The powder coating system 10 may be capable of coating greater than or equal to about 70% of the exposed surface area of the powder particles and less than or equal to about 100% of the exposed surface area of the powder particles. In certain variations, the powder coating system 10 may be capable of coating greater than or equal to about 80% of the exposed surface area of the powder particles and less than or equal to about 100% of the exposed surface area of the powder particles. In still other variations, the powder coating system 10 may be capable of coating greater than or equal to about 90% of the exposed surface area of the powder particles and 100% of the exposed surface area of the powder particles.

This pulsing and purging cycle can be repeated to form multiple monoatomic layers until a coating of the desired thickness and physical properties is achieved. When the appropriate number of cycles has been completed, the coated particles may be removed from the rotary vessel through the loading port.

The above process may be used to form a variety of coatings, such as coatings that are oxide-based, fluoride-based, carbide-based, nitride-based, sulfide-based, or phosphide/semiconductors, by way of non-limiting example. Oxide-based coatings may include: aluminum oxide ($Al_2O_3$), titanium oxide ($TiO_2$), silicon oxide ($SiO_2$), tin dioxide ($SnO_2$), vanadium pentoxide ($V_2O_5$), hafnium dioxide ($HfO_2$), zirconium dioxide ($ZrO_2$), zinc oxide (ZnO), indium oxide ($In_2O_3$), tantalum pentoxide ($Ta_2O_5$), and niobium pentoxide ($Nb_2O_5$). Nitride-based coatings may include: tin nitride (SnN), niobium nitride (NbN), tantalum nitride (TaN), tritantalum pentanitride ($Ta_3N_5$), molybdenum nitride (MoN), tungsten nitride (WN), and boron nitride (BN). Fluoride-based coatings may include aluminum fluoride ($AlF_3$) or lithium fluoride (LiF). Sulfide-based coatings may include: strontium sulfide (SrS), calcium sulfide (CaS), and barium sulfide (BaS). Phosphide-based coatings/semiconductors may include: gallium arsenide (GaAs), silicon (Si), indium arsenide (InAs), indium phosphide (InP), gallium phosphide (GaP), and indium gallium phosphide (InGaP). Suitable precursors may be selected for each of the coatings discussed herein.

In certain variations, the first vapor precursor may comprise aluminum or titanium. As a non-limiting example, the first vapor precursor may be selected from a group consisting of trimethyl aluminum (TMA ($CH_3$)$_3$Al), triethyl aluminum (($C_2H_5$)$_3$Al), diethyl aluminum chloride (($C_2H_5$)$_2$AlCl), tributyl aluminum (($C_4H_9$)$_3$Al), aluminum chloride ($AlCl_3$), aluminum ethoxide (Al($OC_2H_5$)$_3$), aluminum isopropoxide (Al($C_3H_7O$)$_3$), titanium n-butoxide (n-$C_4H_9O$)$_4$Ti), titanium t-butoxide (t-$C_4H_9O$)$_3$Ti), titanium chloride-aluminum chloride ($TiCl_3$.⅓$AlCl_3$), titanium (IV) chloride ($TiCl_4$), titanium (IV) isopropoxide ($C_3H_7O$)$_4$Ti). The second vapor precursor may comprise water vapor or a plasma. Suitable plasmas for ALD include argon (Ar), hydrogen ($H_2$), oxygen ($O_2$), nitrogen ($N_2$), and combinations thereof.

Figure 4D:
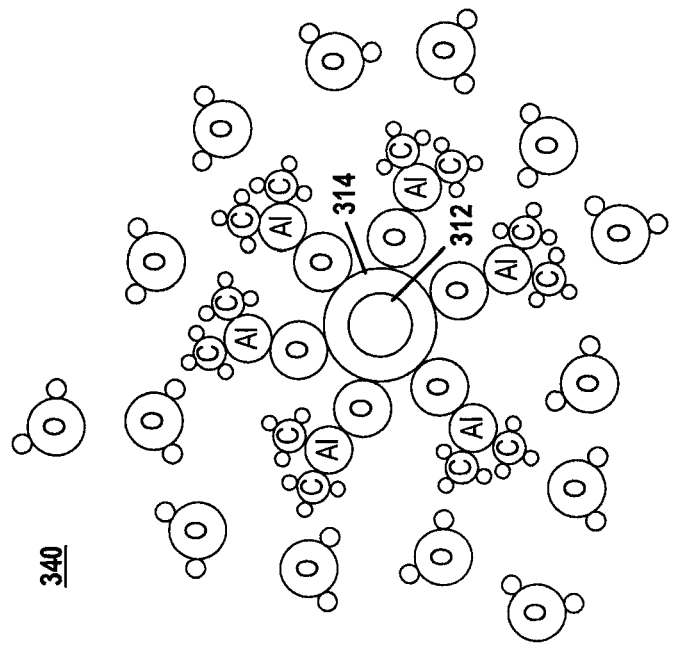

Referring to FIGS. 4A-4F, an exemplary ALD process can be illustrated by the formation of aluminum oxide ($Al_2O_3$) coatings on a nanoparticle using trimethyl aluminum (TMA ($CH_3$)$_3$Al) as a first vapor precursor and water vapor ($H_2O$) as a second vapor precursor. At step 310 in FIG. 4A, a substrate particle 312 has a surface 314 that is first pretreated with oxygen plasma 316 or peroxide ($H_2O_2$) to form a plurality of hydroxide groups (OH) on the surface 314. The presence of the hydroxide groups on surfaces of the substrate particle 312 provides suitable reactive species for the deposition of aluminum or titanium-containing species on the surface 314 of the substrate particle 312. The hydroxide groups may be protected in an argon atmosphere and excess plasma 316 or peroxide may be removed by a flow of argon gas As shown in FIG. 4B at step 320, argon is introduced to the reaction chamber. A predetermined amount of aluminum, in the form of a suitable volatile precursor compound, such as trimethyl aluminum (TMA (($CH_3$)$_3$Al)), is introduced as a vapor (for example at a temperature of about 50° C.) and flows into contact with the exposed surfaces 314 of the substrate particle 312. Preferably, a stoichiometric excess of TMA to hydroxyl or reactive groups on the surface 314 is provided.

Figure 4C:
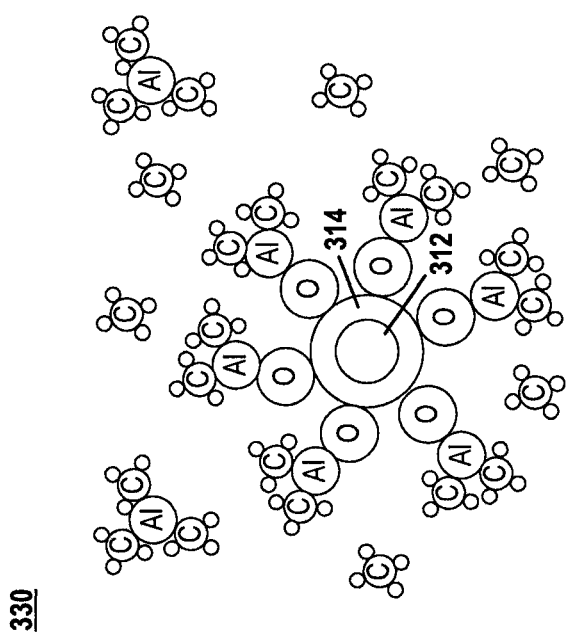
Figure 4F:
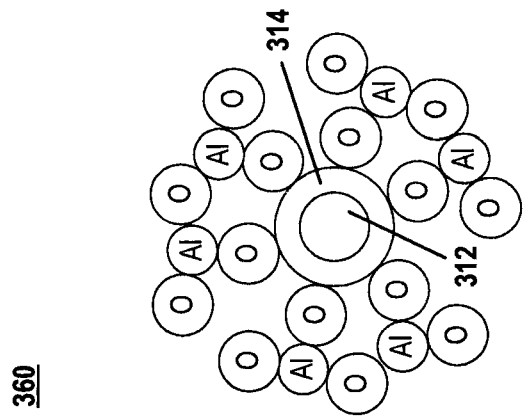

Next, in step 330 in FIG. 4C, the TMA chemisorbs to the oxygen/hydroxyl groups on the surface 314 of the substrate particle 312. Methane ($CH_4$) is released as a byproduct. Typically, reaction of the aluminum-containing material with the surface groups of substrate particle 312 is completed in a short time frame, on the order of a few seconds, for example. The excess TMA and methane ($CH_4$) byproduct are purged from the reaction chamber.

In FIG. 4D at step 340, water vapor ($H_2O$) is introduced into the reaction chamber to flow over the exposed surface 314 of substrate particle 312. Preferably, a stoichiometric excess of water vapor ($H_2O$) to reactive groups on the surface 314 is provided.

Figure 4E:
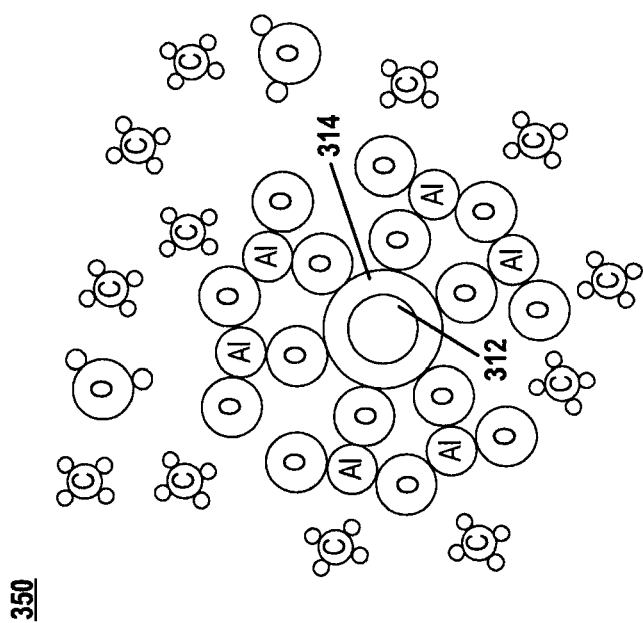

As shown in step 350 in FIG. 4E, the water ($H_2O$) further reacts with the TMA. As such, a conformal layer of aluminum oxide ($Al_2O_3$) forms on the surface 314 of the substrate particle 312. Methane ($CH_4$) is released as a byproduct. The excess water vapor ($H_2O$) and methane ($CH_4$) byproduct are purged from the reaction chamber. As generally shown in step 360 in FIG. 4F, one atomic monolayer of ($Al_2O_3$) is formed. The process in steps 320-340 can be repeated to form additional monolayers of aluminum oxide ($Al_2O_3$) depending on the desired thickness of the coating.

In other aspects, the present disclosure provides a method for atomic layer deposition (ALD) involving fewer or a reduced number of reaction steps when compared to conventional methods. The step reduction is achieved by adding multiple precursors to the reaction chamber simultaneously. More specifically, the high degree of separation of substrate particles during operation of the reactor of the present disclosure enables simultaneous conversion of a first precursor and a second precursor to their respective coatings. In certain variations, the method involves deposition of a metal phosphate thin film on a powder substrate. The powder substrate particles may be loaded into the rotary vessel 14 through the loading port 22. The porous membrane 50 and the rotary vacuum seal 46 may be replaced on the rotary vessel 14. The rotary vessel 14 may be actuated about the center axis A by the motor 18. The powder precursor particles may be pre-treated, for example, by plasma treatment.

A stoichiometric excess of a first vapor precursor and a second vapor precursor may be introduced into the reaction chamber 26 through the precursor inlet 38. The first vapor precursor and the second vapor precursor may be pulsed into the reaction chamber 26 on a carrier gas. The first vapor precursor may comprise a metal halide. In certain variations, the metal halide may be selected from a group consisting of aluminum chloride ($AlCl_3$) and titanium chloride ($TiCl_4$). The second vapor precursor may comprise phosphorous. In some variations, the second vapor precursor may be selected from a group consisting of triethyl phosphine (($C_2H_5$)$_3$P), tri-n-butyl phosphine (n-$C_4H_9$)$_3$P), tri-n-butyl phosphite ((n-$C_4H_9O$)$_3$P), triethyl phosphate (($C_2H_5O$)$_3$PO), triethyl phosphite ($C_2H_5O$)$_3$P, trimethyl phosphate (($CH_3O$)$_3$PO), trimethyl phosphite (($CH_3O$)$_3$P), phosphorous trichloride ($PCl_3$), phosphorous oxychloride ($POCl_3$), and polyphosphoric acid ($H_3PO_4$.$P_2O_5$).

The external heater 54 may be used to bring the reaction chamber 26 and the powder substrate particles to a first temperature. The downstream valve 62 may be closed to increase the pressure of the reaction chamber 26.

The axial baffles 34 may facilitate continuous flow of the powder substrate particles during operation of the powder coating system 10 by causing the powder substrate particles to tumble in the reaction chamber 26 and contact the axial baffles 34. Such contact with the axial baffles 34, especially the first rib 100, the second rib, 104, and the serrated surface 108, will cause the particles to separate and move freely about the reaction chamber 26, creating a constant stream of falling powder. This high degree of separation among of the powder substrate particles enables simultaneous conversion of the first vapor precursor to an oxide and the second vapor precursor to phosphate.

The rotary vessel may continuously rotate while the powder substrate particles are saturated with the first vapor precursor and the second vapor precursor. The valve 62 may be opened so that the excess first vapor precursor, excess second vapor precursor, and reaction byproducts can be removed from the reaction chamber. The excess first vapor precursor, excess second vapor precursor, and reaction byproducts may be quickly purged, for example, by operation of the vacuum pump 70 and/or flushing with an inert gas. The porous membrane 50 may ensure that the powder substrate particles remain in the reaction chamber 26 during removal of the excess first vapor precursor, excess second vapor precursor, and reaction byproducts. Downstream, the filter 66 may trap solid particles as the excess first vapor precursor, excess second vapor precursor, and reaction byproducts are pumped to the exhaust.

A stoichiometric excess of a third vapor precursor may be introduced into the reaction chamber 26 through the precursor inlet 38. The third vapor precursor may be pulsed into the reaction chamber 26 on a carrier gas. The third vapor precursor may comprise oxygen. In certain variations, the third vapor precursor may be selected from a group consisting of water vapor ($H_2O$) and oxygen plasma ($O_2$).

The external heater 54 may be used to bring the reaction chamber 26 and the powder substrate particles to a second temperature. The downstream valve 62 may be closed to increase the pressure of the reaction chamber 26.

The rotary vessel may continuously rotate while the powder substrate particles are saturated with the third vapor precursor, thereby forming a coating of a single atomic layer of the metal phosphate thin film.

The valve 62 may be opened so that the excess third vapor precursor and reaction byproducts can be removed from the reaction chamber. The excess second vapor precursor and reaction byproducts may be quickly purged, for example, by operation of the vacuum pump 70 and/or flushing with an inert gas. The porous membrane 50 may ensure that the powder substrate particles remain in the reaction chamber 26 during removal of the excess first vapor precursor and reaction byproducts. Downstream, the filter 66 may trap solid particles as the excess first vapor precursor and reaction byproducts are pumped to the exhaust. The above process can be repeated to form a coating of multiple layers of the desired thickness.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for vapor deposition of a metal phosphate thin film on a powder substrate in a rotary vessel, the method comprising:
    introducing a powder substrate into a rotating rotary vessel having an inner surface defining a reaction chamber and a plurality of axial baffles, each axial baffle extending inwardly from the inner surface of the rotary vessel;
    concurrently exposing the powder substrate to a stoichiometric excess of a first precursor and a stoichiometric excess of a second precursor, wherein the first precursor comprises a metal halide and the second precursor comprises a phosphorous source;
    removing the excess first precursor, excess second precursor, and reaction byproducts;
    after removing the excess first precursor, the excess second precursor, and the reaction byproducts, exposing the powder substrate to a stoichiometric excess of a third precursor, wherein the third precursor comprises an oxygen source; and
    removing the excess third precursor and reaction byproducts, thereby forming the powder substrate having the metal phosphate thin film.

2. The method of claim 1, wherein the metal halide is selected from a group consisting of: aluminum chloride ($AlCl_3$) and titanium chloride ($TiCl_4$), the phosphorous source is selected from a group consisting of: triethyl phosphine (($C_2H_5$)$_3$P), tri-n-butyl phosphine (n-$C_4H_9$)$_3$P, tri-n-butyl phosphite ((n-$C_4H_9$O)$_3$P), triethyl phosphate (($C_2H_5$O)$_3$PO), triethyl phosphite ($C_2H_5$O)$_3$P, trimethyl phosphate (($CH_3$O)$_3$PO), trimethyl phosphite (($CH_3$O)$_3$P), phosphorous trichloride ($PCl_3$), phosphorous oxychloride ($POCl_3$), and polyphosphoric acid ($H_3PO_4 \cdot P_2O_5$), and the oxygen source is selected from a group consisting of: water ($H_2O$) and oxygen ($O_2$) plasma.

3. The method of claim 2, wherein:
    the concurrently exposing the powder substrate to the stoichiometric excess of the first precursor and the stoichiometric excess of the second precursor occurs at a first temperature;
    the third precursor comprises oxygen ($O_2$) plasma; and
    the exposing the powder substrate to the stoichiometric excess of the third precursor occurs at a second temperature less than the first temperature.

4. The method of claim 3, wherein the first temperature is greater than or equal to about 150° C. and less than or equal to about 250° C. and the second temperature is greater than or equal to about 50° C. and less than or equal to about 100° C.

* * * * *